United States Patent
Liang et al.

(10) Patent No.: US 10,720,341 B2
(45) Date of Patent: Jul. 21, 2020

(54) GAS DELIVERY SYSTEM FOR HIGH PRESSURE PROCESSING CHAMBER

(71) Applicant: Micromaterials, LLC, Wilmington, DE (US)

(72) Inventors: Qiwei Liang, Fremont, CA (US); Srinivas D. Nemani, Sunnyvale, CA (US); Sean S. Kang, San Ramon, CA (US); Adib Khan, Cupertino, CA (US); Ellie Y. Yieh, Sunnyvale, CA (US)

(73) Assignee: Micromaterials, LLC, Wilmington, DE (US)

( * ) Notice: Subject to any disclaimer, the term of this patent is extended or adjusted under 35 U.S.C. 154(b) by 0 days.

(21) Appl. No.: 16/182,612

(22) Filed: Nov. 7, 2018

(65) Prior Publication Data

US 2019/0148178 A1 May 16, 2019

Related U.S. Application Data

(60) Provisional application No. 62/584,794, filed on Nov. 11, 2017.

(51) Int. Cl.
*G01R 31/26* (2020.01)
*H01L 21/67* (2006.01)
(Continued)

(52) U.S. Cl.
CPC .... *H01L 21/67017* (2013.01); *C23C 16/4412* (2013.01); *C23C 16/455* (2013.01);
(Continued)

(58) Field of Classification Search
CPC combination set(s) only.
See application file for complete search history.

(56) References Cited

U.S. PATENT DOCUMENTS

| 4,524,587 A | 6/1985 | Kantor |
| 5,050,540 A | 9/1991 | Lindberg |

(Continued)

FOREIGN PATENT DOCUMENTS

| CN | 101871043 A | 10/2010 |
| CN | 104047676 A | 9/2014 |

(Continued)

OTHER PUBLICATIONS

Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.

(Continued)

*Primary Examiner* — Robert G Bachner
(74) *Attorney, Agent, or Firm* — Patterson + Sheridan, LLP (57) ABSTRACT

A high-pressure processing system for processing a layer on a substrate includes a first chamber, a support to hold the substrate in the first chamber, a second chamber adjacent the first chamber, a foreline to remove gas from the second chamber, a vacuum processing system configured to lower a pressure within the second chamber to near vacuum, a valve assembly between the first chamber and the second chamber to isolate the pressure within the first chamber from the pressure within the second chamber, a gas delivery system configured to increase the pressure within the first chamber to at least 10 atmospheres while the first chamber is isolated from the second chamber, an exhaust system comprising an exhaust line to remove gas from the first chamber, and a common housing surrounding both the first gas delivery module and the second gas delivery module.

9 Claims, 6 Drawing Sheets

(51) Int. Cl.
*H01L 21/66* (2006.01)
*H01L 21/324* (2006.01)
*C23C 16/44* (2006.01)
*C23C 16/455* (2006.01)

(52) U.S. Cl.
CPC ........ *H01L 21/324* (2013.01); *H01L 21/6719* (2013.01); *H01L 21/67069* (2013.01); *H01L 21/67109* (2013.01); *H01L 21/67253* (2013.01); *H01L 22/20* (2013.01); *H01L 21/67167* (2013.01)

(56) References Cited

U.S. PATENT DOCUMENTS

| | | |
|---|---|---|
| 5,114,513 A | 5/1992 | Hosokawa et al. |
| 5,149,378 A | 9/1992 | Ohmi et al. |
| 5,175,123 A | 12/1992 | Vasquez et al. |
| 5,319,212 A | 6/1994 | Tokoro |
| 5,366,905 A | 11/1994 | Mukai |
| 5,590,695 A | 1/1997 | Siegele et al. |
| 5,620,524 A | 4/1997 | Fan et al. |
| 5,808,245 A | 9/1998 | Wiese et al. |
| 5,858,051 A | 1/1999 | Komiyama et al. |
| 5,879,756 A | 3/1999 | Fathi et al. |
| 5,880,041 A | 3/1999 | Ong |
| 5,940,985 A | 8/1999 | Kamikawa et al. |
| 6,082,950 A | 7/2000 | Altwood et al. |
| 6,136,664 A | 10/2000 | Economikos et al. |
| 6,150,286 A | 11/2000 | Sun et al. |
| 6,164,412 A | 12/2000 | Allman |
| 6,242,368 B1 | 6/2001 | Holmer et al. |
| 6,251,751 B1 | 6/2001 | Chu et al. |
| 6,299,753 B1 | 10/2001 | Chao et al. |
| 6,319,766 B1 | 11/2001 | Bakli et al. |
| 6,334,266 B1 | 1/2002 | Moritz et al. |
| 6,368,412 B1 | 4/2002 | Gomi |
| 6,442,980 B2 | 9/2002 | Preston et al. |
| 6,500,603 B1 | 12/2002 | Shioda |
| 6,583,497 B2 | 6/2003 | Xia et al. |
| 6,619,304 B2 | 9/2003 | Worm |
| 6,797,336 B2* | 9/2004 | Garvey .................. B82Y 30/00 427/561 |
| 7,055,333 B2 | 6/2006 | Leitch et al. |
| 7,111,630 B2 | 9/2006 | Mizobata et al. |
| 7,114,517 B2 | 10/2006 | Sund et al. |
| 7,282,458 B2 | 10/2007 | Gates et al. |
| 7,361,231 B2 | 4/2008 | Fury et al. |
| 7,460,760 B2 | 12/2008 | Cho et al. |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,650,965 B2 | 1/2010 | Thayer et al. |
| 7,651,959 B2 | 1/2010 | Fukazawa et al. |
| 7,655,532 B1 | 2/2010 | Chen et al. |
| 7,825,038 B2 | 11/2010 | Ingle et al. |
| 7,825,042 B2 | 11/2010 | Mandal |
| 7,867,923 B2 | 1/2011 | Mallick et al. |
| 7,891,228 B2 | 2/2011 | Ding et al. |
| 8,027,089 B2 | 9/2011 | Hayashi |
| 8,318,584 B2 | 11/2012 | Li et al. |
| 8,349,085 B2 | 1/2013 | Tahara et al. |
| 8,449,942 B2 | 5/2013 | Liang et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,647,992 B2 | 2/2014 | Liang et al. |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2* | 9/2015 | Yamamoto .............. F16K 51/02 |
| 9,153,442 B2 | 10/2015 | Wang et al. |
| 9,157,730 B2 | 10/2015 | Rajagopalan et al. |
| 9,257,314 B1 | 2/2016 | Rivera et al. |
| 9,306,026 B2 | 4/2016 | Toriumi et al. |
| 9,362,107 B2 | 6/2016 | Thadani et al. |
| 9,484,406 B1 | 11/2016 | Sun et al. |
| 9,570,551 B1 | 2/2017 | Balakrishnan et al. |
| 10,083,834 B2 | 9/2018 | Thompson et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2002/0073922 A1 | 6/2002 | Frankel et al. |
| 2002/0122885 A1 | 9/2002 | Ahn |
| 2002/0134439 A1* | 9/2002 | Kawasaki ........... C23C 16/4412 137/565.23 |
| 2002/0148492 A1 | 10/2002 | Yamagata et al. |
| 2002/0151128 A1 | 10/2002 | Lane et al. |
| 2003/0030945 A1 | 2/2003 | Heinonen et al. |
| 2003/0101938 A1 | 6/2003 | Ronsse et al. |
| 2003/0148035 A1 | 8/2003 | Lingampalli |
| 2003/0148631 A1 | 8/2003 | Kuo et al. |
| 2003/0207593 A1 | 11/2003 | Derderian et al. |
| 2004/0025908 A1 | 2/2004 | Douglas et al. |
| 2004/0060519 A1 | 4/2004 | Beauchaine et al. |
| 2004/0112409 A1 | 6/2004 | Schilling |
| 2004/0219800 A1 | 11/2004 | Tognetti |
| 2004/0248392 A1 | 12/2004 | Narwankar et al. |
| 2005/0003655 A1 | 1/2005 | Cathey et al. |
| 2005/0051194 A1 | 3/2005 | Sakashita et al. |
| 2005/0136684 A1 | 6/2005 | Mukai et al. |
| 2005/0191828 A1 | 9/2005 | Al-Bayati et al. |
| 2005/0198971 A1 | 9/2005 | Leitch et al. |
| 2005/0250347 A1 | 11/2005 | Bailey et al. |
| 2005/0269291 A1 | 12/2005 | Kent |
| 2006/0003596 A1 | 1/2006 | Fucsko et al. |
| 2006/0124613 A1 | 6/2006 | Kumar et al. |
| 2006/0207633 A1 | 9/2006 | Kim et al. |
| 2006/0226117 A1 | 10/2006 | Bertram et al. |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0187386 A1 | 8/2007 | Kim et al. |
| 2007/0204779 A1 | 9/2007 | Fischer |
| 2007/0212850 A1 | 9/2007 | Ingle et al. |
| 2007/0243317 A1 | 10/2007 | Du Bois et al. |
| 2007/0256559 A1 | 11/2007 | Chen et al. |
| 2008/0074658 A1 | 3/2008 | Davis et al. |
| 2008/0115726 A1 | 5/2008 | Ingle et al. |
| 2008/0210273 A1 | 9/2008 | Joe |
| 2009/0081884 A1 | 3/2009 | Yokota et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0173495 A1 | 7/2010 | Thakur et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0142192 A1 | 6/2012 | Li et al. |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2012/0304485 A1 | 12/2012 | Hayashi et al. |
| 2013/0194350 A1 | 8/2013 | Watanabe et al. |
| 2013/0233170 A1 | 9/2013 | Spiegelman et al. |
| 2013/0330042 A1 | 12/2013 | Nara et al. |
| 2013/0337171 A1 | 12/2013 | Sasagawa |
| 2014/0023320 A1 | 1/2014 | Lee et al. |

(56) References Cited

U.S. PATENT DOCUMENTS

| | | |
|---|---|---|
| 2014/0045300 A1 | 2/2014 | Chen et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0183743 A1 | 7/2014 | Matsumoto et al. |
| 2014/0231384 A1 | 8/2014 | Underwood et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0284821 A1 | 9/2014 | Hubbard |
| 2014/0322921 A1 | 10/2014 | Ahmad et al. |
| 2015/0000870 A1 | 1/2015 | Hosotani et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0099342 A1 | 4/2015 | Tsai et al. |
| 2015/0159272 A1 | 6/2015 | Yoon et al. |
| 2015/0179501 A1 | 6/2015 | Jhaveri et al. |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0111272 A1 | 4/2016 | Girard et al. |
| 2016/0118391 A1 | 4/2016 | Zhao et al. |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0334162 A1 | 11/2016 | Kim et al. |
| 2016/0353522 A1 | 12/2016 | Rathi et al. |
| 2017/0005204 A1 | 1/2017 | Hosoba et al. |
| 2017/0011932 A1 | 1/2017 | Pethe et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0019249 A1 | 1/2018 | Zhang et al. |
| 2018/0023192 A1 | 1/2018 | Chandra et al. |
| 2018/0261480 A1 | 9/2018 | Liang et al. |
| 2018/0350563 A1 | 12/2018 | Manna et al. |
| 2019/0259625 A1 | 8/2019 | Nemani et al. |

FOREIGN PATENT DOCUMENTS

| | | |
|---|---|---|
| CN | 104089491 A | 10/2014 |
| JP | H07048489 B2 | 5/1995 |
| JP | 2001110729 A | 4/2001 |
| JP | 2003-51474 A | 2/2003 |
| JP | 2004127958 A | 4/2004 |
| JP | 2005064269 A | 3/2005 |
| JP | 2005-333015 A | 12/2005 |
| JP | 2007242791 A | 9/2007 |
| JP | 2008/073611 A | 4/2008 |
| JP | 2010-205854 A | 9/2010 |
| JP | 2012-503883 A | 2/2012 |
| JP | 2012-204656 A | 10/2012 |
| JP | 2013-105777 A | 5/2013 |
| JP | 2013516788 A | 5/2013 |
| JP | 2013-179244 A | 9/2013 |
| JP | 2014019912 A | 2/2014 |
| KR | 20070075383 A | 7/2007 |
| KR | 20090011463 A | 2/2009 |
| KR | 1020090040867 A | 4/2009 |
| KR | 20140003776 A | 1/2014 |
| KR | 20140135744 A | 11/2014 |
| KR | 20150006587 A | 1/2015 |
| KR | 20150122432 A | 11/2015 |
| TW | 200529284 A | 9/2005 |
| TW | 200721316 A | 6/2007 |
| TW | 201507174 A | 2/2015 |
| WO | 2008/089178 A2 | 7/2008 |
| WO | 2011/103062 A2 | 8/2011 |
| WO | 2012/133583 A1 | 10/2012 |
| WO | 2016065219 A1 | 4/2016 |

OTHER PUBLICATIONS

Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
Office Action for Japanese Application No. 2018-546484 dated Oct. 8, 2019.
International Search Report and Written Opinion for International Application No. PCT/US2019/040195 dated Oct. 25, 2019.
Taiwan Office Action dated Jun. 11, 2019 for Application No. 107138905.
International Search Report and Written Opinion for International Application No. PCT/US2019/029602 dated Aug. 14, 2019.
International Search Report and Written Opinion for PCT/US2018/021715 dated Jun. 22, 2018.
International Search Report and Written Opinion from PCT/US2018/034036 dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
International Search Report and Written Opinion for PCT/US2018/038822 dated Oct. 26, 2018.
International Search Report and Written Opinion for PCT/US2019/014759 dated May 14, 2019.
International Search Report and Written Opinion for PCT/US2019/015332 dated May 15, 2019.
International Search Report and Written Opinion for PCT/US2018/059676 dated May 23, 2019.
International Search Report and Written Opinion for PCT/US2019/023431 dated Jul. 5, 2019.
Haskel Pressure on Demand, Pneumatic and Hydraulic Driven Gas Boosters, Apr. 30, 2016, 36 pp.
Taiwan Office Action dated Jul. 3, 2019 for Application No. 107136181.
International Search Report and Written Opinion for PCT/US2018/043160 dated Jan. 31, 2019.
International Search Report and Written Opinion for PCT/US2018/059643 dated Feb. 26, 2019.
International Search Report and Written Opinion from PCT/US2019/012161 dated Apr. 30, 2019.
Taiwan Office Action dated Nov. 19, 2019 for Application No. 108103415.
Office Action for Japanese Application No. 2018-517285 dated Oct. 23, 2019.
Office Action for Taiwan Patent Application No. 108111501 dated Nov. 14, 2019.

* cited by examiner

GAS DELIVERY SYSTEM FOR HIGH PRESSURE PROCESSING CHAMBER

RELATED APPLICATIONS

This application claims benefit from U.S. Provisional Application Ser. No. 62/584,794, filed Nov. 11, 2017, which is incorporated by reference in its entirety.

TECHNICAL FIELD

This invention relates to a high pressure processing chamber for integrated circuit fabrication.

BACKGROUND

Micro-electronic circuits and other micro-scale devices are generally manufactured from a substrate, such as a silicon or other semiconductor material substrate. Multiple metal layers are applied onto the substrate to form micro-electronic or other micro-scale components or to provide electrical connections. These metal layers, e.g., copper, are plated onto the substrate, and form the components and interconnects in a sequence of photolithographic, plating, etching, polishing, or other operations.

To achieve desired material properties the substrate is typically put through an annealing process in which the substrate is quickly heated, usually to about 200-500° C. The substrate may be held at these temperatures for a relatively short time, e.g., 60-300 seconds. The substrate is then rapidly cooled, with the entire process usually taking only a few minutes. Annealing may be used to change the material properties of the layers on the substrate. It may also be used to activate dopants, drive dopants between films on the substrate, change film-to-film or film-to-substrate interfaces, densify deposited films, or to repair damage from ion implantation.

As feature sizes for microelectronic devices and interconnects become smaller, the allowable defect rate decreases substantially. Some defects result from contaminant particles. Other defects can result from incomplete processing of certain regions of the substrate, e.g., failure to grow a film at the bottom of a trench.

Various annealing chambers have been used in the past. In single substrate processing equipment, these annealing chambers typically position the substrate between or on heating and cooling elements, to control the temperature profile of the substrate. However, achieving precise and repeatable temperature profiles, as well as an acceptable level of defects, can present engineering challenges.

SUMMARY

In one example, a high-pressure processing system for processing a layer on a substrate is provided. The system includes a first chamber, a support to hold the substrate in the first chamber, a second chamber adjacent the first chamber, a foreline to remove gas from the second chamber, a vacuum processing system configured to lower a pressure within the second chamber, a valve assembly between the first chamber and the second chamber to isolate the pressure within the first chamber from the pressure within the second chamber, a gas delivery system configured to introduce one or more gases into the first chamber and to increase the pressure within the first chamber to at least 10 atmospheres while the gas is in the first chamber and while the first chamber is isolated from the second chamber, a controller configured to operate the gas delivery system and the valve assembly, an exhaust system comprising an exhaust line to remove gas from the first chamber, and a common housing surrounding both the first gas delivery module and the second gas delivery module. The gas delivery system includes a first gas delivery module to deliver a first gas at a first pressure that is at least 10 atmospheres, and a second gas delivery module to deliver the first gas or a second gas of different composition at a second pressure that is less than the first pressure but greater than 1 atmosphere.

Implementations may include one or more of the following features.

A second exhaust system may be configured to remove gas from the common housing. The second exhaust system may be configured to direct gas from the housing to the foreline. First and second delivery lines may couple the first and second gas delivery modules to the first chamber. A containment enclosure may be configured to divert gas leaking from the first and second delivery lines to the foreline. The common housing may be fluidically isolated from the containment enclosure.

In another example, a high-pressure processing system for processing a layer on a substrate includes a first chamber, a support to hold the substrate in the first chamber, a second chamber adjacent the first chamber, a foreline to remove gas from the second chamber, a vacuum processing system configured to lower a pressure within the second chamber to near vacuum, a valve assembly between the first chamber and the second chamber to isolate the pressure within the first chamber from the pressure within the second chamber, a gas delivery system configured to introduce one or more gases into the first chamber and to increase the pressure within the first chamber to at least 10 atmospheres while the gas is in the first chamber and while the first chamber is isolated from the second chamber, an exhaust system comprising an exhaust line to remove gas from the first chamber, and a controller. The gas delivery system includes a first gas delivery module to deliver a first gas at a first pressure that is at least 10 atmospheres, and a second gas delivery module to deliver the first gas or a second gas of different composition at a second pressure that is less than the first pressure but greater than 1 atmosphere. The controller is configured configured to operate the gas delivery system, valve assembly, vacuum processing system and exhaust system such that the valve assembly isolates the first chamber from the second chamber, then the second gas delivery module raises the first chamber from a pressure below 1 atmosphere to the second pressure, then the second gas delivery module is isolated from the first chamber, and then the first gas delivery module raises the first chamber from the second pressure to the first pressure.

Implementations may include one or more of the following features.

The first gas delivery module may include a pump configured to increase pressure of the first gas before delivering the first gas to the first chamber. The second gas delivery module may use a mass flow controller, liquid flow meter or liquid flow controller to direct the gas to the first chamber. A first pressure sensor may be positioned in the first chamber and a second pressure sensor may be positioned in the second chamber. The controller may be configured to cause the exhaust system to reduce pressure in the first chamber and cause the vacuum processing system to reduce pressure in the second chamber. The controller may be configured to compare measurements from the first pressure sensor and the second pressure sensor and control the exhaust system and the vacuum processing system such that a pressure in the first chamber is higher than a pressure in the second chamber.

In another example, a method of operating a high-pressure processing system is provided that includes bringing a first chamber and a second chamber to a first pressure that is less than one atmosphere, while an isolation valve between the first chamber and second chamber is open transporting a substrate from the second chamber into the first chamber, while the isolation valve is closed reducing the first chamber from the first pressure to a second pressure and reducing the second chamber from the first pressure to a third pressure, pressurizing the first chamber to a fourth pressure that is above atmospheric pressure and less than 10 atmospheres with a second gas delivery module, pressurizing the first chamber to a fifth pressure that is above 10 atmospheres with a first gas delivery module, processing the substrate while the first chamber is at the fifth pressure, evacuating first chamber, and opening the isolation valve and removing the substrate from the first chamber.

Implementations may include one or more of the following features.

Pressuring the first chamber to the fifth pressure may include supplying a first gas to the first chamber, and pressurizing the first chamber to the fourth pressure may include supplying a second gas of different composition to the first chamber. The first gas may include at least one of $H_2$ or $NH_3$. Pressurizing the first chamber with the second gas delivery module may include isolating the first gas delivery module from the first chamber with a high-pressure isolation valve in a delivery line between the first gas delivery module and the first chamber and fluidically coupling the second gas delivery module and the first chamber by opening a low-pressure isolation valve in a delivery line between the second gas delivery module and the first chamber. Pressurizing the first chamber with the first gas delivery module may include isolating the second gas delivery module from the first chamber with the low-pressure isolation valve and fluidically coupling the first gas delivery module and the first chamber by opening the high-pressure isolation valve.

The third pressure may be than the second pressure. Measurements from a first pressure sensor in the first chamber and a second pressure sensor in the second chamber may be compared and pressure may be continued to be reduced in the first chamber and second pressure until a pressure in the first chamber is higher than a pressure in the second chamber. Evacuating the first chamber may include lowering a pressure in the first chamber to a sixth pressure that is less than the first pressure. The sixth pressure may be greater than the third pressure.

Implementations may include one or more of the following advantages.

High pressure can be established in a chamber more safely. Leaks can be detected.

A layer can be treated or formed more uniformly across the substrate. In addition, high-pressure processing can also provide access to chemical reactions that are not available at lower pressures.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

As noted above, some defects can result from incomplete processing of certain regions of a substrate. However, high-pressure processing (e.g., annealing or deposition) can improve consistency of processing across the substrate. In particular, annealing can occur in a high-pressure environment. Where a layer is formed using an annealing process, e.g., by thermal oxidation or other process in which chemistry diffuses into and reacts with the material disposed on substrate, the high pressure can help improve thoroughness of surface coverage of the layer of material on the substrate. For example, problems of treatment formation of a layer in a trench can be reduced. As a result, a layer can be treated or formed more uniformly across the substrate. In addition, high-pressure processing (e.g., annealing or deposition) can also provide access to chemical reactions that are not available at lower pressures.

Another issue is that certain materials, such as copper, will rapidly oxidize when exposed to oxygen, at temperatures over about 70° C. If the copper or other material oxidizes, the substrate may no longer be useable, or the oxide layer must first be removed before further processing. These are both unacceptable options for efficient manufacturing. Accordingly, a design factor is to isolate the substrate from oxygen, particularly when the substrate temperature is over about 70° C. Since oxygen is of course present in ambient air, avoiding oxidation of copper during annealing also can present engineering challenges. As described herein, the substrate can be transferred between the high-pressure processing chamber and different processing chambers in the low-pressure, e.g., near-vacuum, environment to avoid contamination and oxidation of the substrate.

Another consideration is pressure. Very high pressures can improve the consistency and quality of the substrates produced. However, systems that have high pressure (e.g., above 10 atm, above 15 atm, or up to 20 atm) are at high risk of breach and loss of containment. A system with enhanced safety features is beneficial for use of such ultra-high pressure processing.

Figure 1:
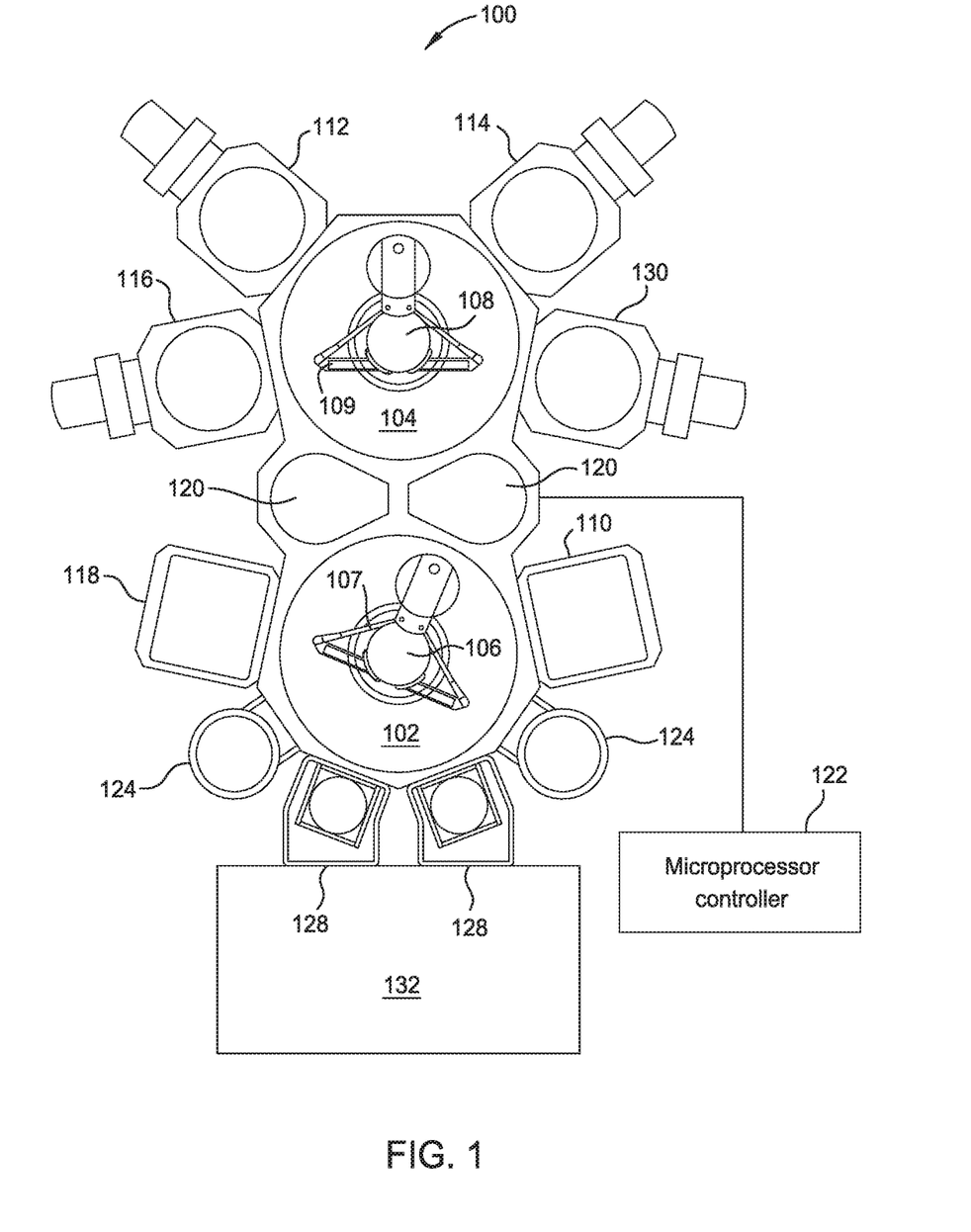
FIG. 1 is a diagram of a processing platform.

FIG. 1 shows an integrated multi-chamber substrate processing system suitable for performing at least one embodiment of physical vapor deposition, chemical vapor deposition, and/or annealing processes. In general, the multi-chamber substrate processing system includes at least one high-pressure processing chamber, e.g., able to operate at pressures above 10 atmospheres, to perform a high-pressure process such as deposition or annealing, and at least one low-pressure processing chamber, e.g., able to operate a low pressure, e.g., below 1 atmosphere, to perform a low-pressure process such as etching, deposition, or thermal treatment. In some implementations the multi-chamber processing system is a cluster tool having a central transfer chamber that is at low pressure and from which multiple processing chambers can be accessed.

Some embodiments of the processes and systems described herein relate to depositing layers of material, e.g., metal and metal silicide barriers, for feature definitions. For example, a first metal layer is deposited on a silicon substrate and annealed to form a metal silicide layer. A second metal layer is then deposited on the metal silicide layer to fill the feature. The annealing process to form the metal silicide layer may be performed in multiple annealing operations.

FIG. 1 is a schematic top view of one embodiment a processing platform 100 including two transfer chambers 102, 104, transfer robots 106, 108 positioned in the transfer chambers 102, 104, respectfully, and processing chambers 110, 112, 114, 116, 118, 130, disposed on the two transfer chambers 102, 104. The first and second transfer chambers 102, 104 are central vacuum chambers that interface with adjacent processing chambers 110, 112, 114, 116, 118, 130.

The first transfer chamber 102 and the second transfer chamber 104 are separated by pass-through chambers 120, which may comprise cool-down or pre-heating chambers. The pass-through chambers 120 also may be pumped down or ventilated during substrate handling when the first transfer chamber 102 and the second transfer chamber 104 operate at different pressures. For example, the first transfer chamber 102 may operate between about 100 milliTorr and about 5 Torr, such as about 40 milliTorr, and the second transfer chamber 104 may operate between about $1\times10^{-5}$ Torr and about $1\times10^{-8}$ Torr, such as about $1\times10^{-7}$ Torr.

The processing platform 100 is operated by a programmed controller 122. The controller 122 can control the transfer robots 106, 108 to transport the substrates between the chambers, and can cause each of the chambers of the processing platform 100 to perform individual operations to process the substrate.

The first transfer chamber 102 is coupled with two degas chambers 124, two load lock chambers 128, a reactive pre-clean chamber 118, at least one physical vapor deposition chamber 110, and the pass-through chambers 120. The pre-clean chamber may be a PreClean II chamber, commercially available from Applied Materials, of Santa Clara, Calif. Substrates (not shown) are loaded into the processing platform 100 through load lock chambers 128. For example, a factory interface module 132, if present, would be responsible for receiving one or more substrates, e.g., cassettes of substrates, or enclosed pods of substrates, from either a human operator or an automated substrate handling system. The factory interface module 132 can open the cassettes or pods of substrates, if applicable, and move the substrates to and from the load lock chambers 128. The processing chambers 110, 112, 114, 116, 118, 130 receive the substrates from the transfer chambers 102, 104, process the substrates, and allow the substrates to be transferred back into the transfer chambers 102, 104. After being loaded into the processing platform 100, the substrates are sequentially degassed and cleaned in degas chambers 124 and the pre-clean chamber 118, respectively.

Each of the processing chambers are isolated from the transfer chambers 102, 104 by an isolation valve which allows the processing chambers to operate at a different level of vacuum than the transfer chambers 102, 104 and prevents any gasses being used in the processing chamber from being introduced into the transfer chamber. The load lock chambers 128 are also isolated from the transfer chamber 102, 104 with isolation valves. Each load lock chamber 128 has a door which opens to the outside environment, e.g., opens to the factory interface module 132. In normal operation, a cassette loaded with substrates is placed into the load lock chamber 128 through the door from the factory interface module 132 and the door is closed. The load lock chamber 128 is then evacuated to the same pressure as the transfer chamber 102 and the isolation valve between the load lock chamber 128 and the transfer chamber 102 is opened. The robot in the transfer chamber 102 is moved into position and one substrate is removed from the load lock chamber 128. The load lock chamber 128 is equipped with an elevator mechanism so as one substrate is removed from the cassette, the elevator moves the stack of substrates in the cassette to position another substrate in the transfer plane so that it can be positioned on the robot blade.

The transfer robot 106 in the transfer chamber 102 rotates with the substrate so that the substrate is aligned with a processing chamber position. The processing chamber is flushed of any toxic gasses, brought to the same pressure level as the transfer chamber, and the isolation valve is opened. The transfer robot 106 then moves the substrate into the processing chamber where it is lifted off the robot. The transfer robot 106 is then retracted from the processing chamber and the isolation valve is closed. The processing chamber then goes through a series of operations to execute a specified process on the substrate. When complete, the processing chamber is brought back to the same environment as the transfer chamber 102 and the isolation valve is opened. The transfer robot 106 removes the substrate from the processing chamber and then either moves it to another processing chamber for another operation or replaces it in the load lock chamber 128 to be removed from the processing platform 100 when the entire cassette of substrates has been processed.

The transfer robots 106, 108 include robot arms 107, 109, respectively, that support and move the substrate between different processing chambers. The transfer robot 106 moves the substrate between the degas chambers 124 and the pre-clean chamber 118. The substrate may then be transferred to the long throw PVD chamber 110 for deposition of a material thereon.

The second transfer chamber 104 is coupled to a cluster of processing chambers 116, 112, 114, 130. The processing chambers 116, 112 may be chemical vapor deposition (CVD) chambers for depositing materials, such as tungsten, as desired by the operator. The PVD processed substrates are moved from the first transfer chamber 102 into the second transfer chamber 104 via the pass-through chambers 120. Thereafter, the transfer robot 108 moves the substrates between one or more of the processing chambers 116, 112, 114, 130 for material deposition and annealing as required for processing.

Of course, all of the above is simply an exemplary implementation; each transfer chamber could have just a different number of processing chambers, e.g., one to five chambers, the processing chambers could have different distribution of functions, the system could have a different number of transfer chambers, e.g., just a single transfer chamber, and the transfer chambers could be omitted entirely and the system could have just a single stand-alone processing chamber.

Figure 2:
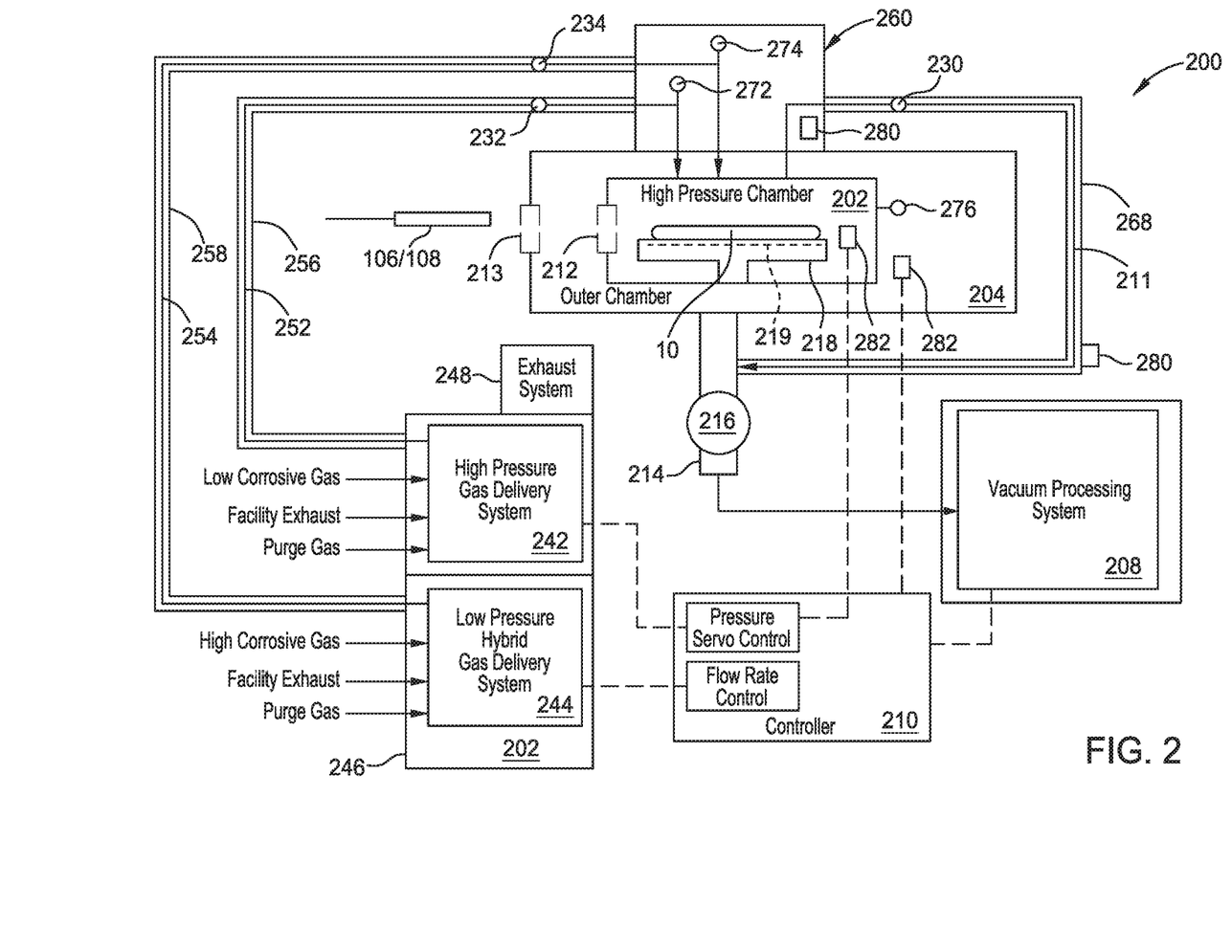
FIG. 2 is a diagram of a high-pressure processing system with enhanced safety features.

FIG. 2 illustrates a controlled high-pressure processing system 200 that creates a high-pressure environment for processing a substrate and a low-pressure environment for the substrate when the substrate is being transferred between processing chambers. The controlled high-pressure processing system 200 includes a high-pressure inner first chamber 202 and low-pressure outer second chamber 204.

The first chamber 202 can correspond to one of the processing chambers 110, 112, 114, 116, 118, 130 of the processing platform 100, and the second chamber 204 can correspond to one of the transfer chambers 102, 104 of the processing platform 100. Alternatively, in some implementations, one of the processing chambers 110, 112, 114, 116, 118, 130 includes both the first chamber 202 and the second chamber 204. The first chamber 202 can correspond to an inner chamber, and the second chamber 204 can correspond to an outer chamber surrounding the inner chamber.

The pressure within the first chamber 202 can be controlled independently of the pressure in the second chamber 204. If the first and second chambers 202, 204 are distinct from the transfer chambers, the first and second chambers 202, 204 can have pressures that are controlled independently of the pressures within the transfer chambers. The controlled high-pressure system 200 further includes a gas delivery system 206, a vacuum processing system 208, and a controller 210. In some examples, the controller 122 of the processing platform 100 can include the controller 210.

The first chamber 202 is configured, e.g., sealed and reinforced, to accommodate very high pressures, e.g., a pressure of at least 10 atmospheres, e.g., a pressure of 40-80 atm. In contrast, the second chamber 204 is configured, e.g., sealed and reinforced, to accommodate very low pressures, e.g., a pressure lower than 1 atmosphere, e.g., a pressure down to about 100 mtorr. The low pressure environment of the second chamber 204 can inhibit contamination and/or oxidation of the substrate or the material deposited on the substrate.

The second chamber 204 is adjacent to the first chamber 202. In some implementations, the second chamber 204 also surrounds the first chamber 202 (if the second chamber 204 does not surround the first chamber, the second chamber can still be considered an outer chamber in that the substrate would pass through the second chamber to reach the first chamber). In some implementations, the second chamber 204 substantially surrounds, e.g., at least 80%, the first chamber 202.

As noted above, the second chamber 204 can correspond to a transfer chamber, e.g., the transfer chamber 102 or the transfer chamber 104, which receives the substrate between different processing chambers. Alternatively, the second chamber 204 can be a separate chamber located between the first chamber 202 and the transfer chamber 102 or the transfer chamber 104.

The inner (e.g., first) chamber 202 includes a substrate support 218, e.g., a pedestal, to support a workpiece, such as a substrate 10, which is to be processed, e.g., subject to annealing or on which a layer of material is to be deposited. The support 218 is positioned or positionable within the first chamber 202. In some implementations, the substrate 10 sits directly on a flat top surface of the pedestal. In some implementations, the substrate sits on lift pins that project from the pedestal.

A first valve assembly 212 between the first chamber 202 and the second chamber 204 isolates the pressure within the first chamber 202 from the pressure within the second chamber 204. The high-pressure environment within the first chamber 202 can thus be separated and sealed from the low pressure environment within the second chamber 204. The first valve assembly 212 is openable to enable the substrate 10 to be transferred from or through the second chamber 204 into the first chamber 202, or to enable the substrate to be transferred from the first chamber 202 into or through the second chamber 204.

A second valve assembly 213 between the second chamber 204 and an exterior environment, e.g., a transfer chamber 204 isolates the pressure within the second chamber 204 from the pressure outside the second chamber 204.

The gas delivery system 206 is configured to pressurize the first chamber 202. In particular, the gas delivery system 206 can delivers the processing gas to the first chamber 202 and establishes a high pressure, e.g., at a pressure of at least 10 atmospheres, e.g., above 15 atm, above 20 atm, above 30 atm, up to 50 atm, up to 60 atm, up to 70 atm, up to 80 atm, in the first chamber. The processing gas can react with the substrate 10, e.g., a layer on the substrate 10, e.g., during an annealing process, or serve as a source for material to be deposited on the substrate.

In some implementations, the gas delivery system 206 includes a first gas delivery module 242 to deliver a first gas to the first chamber 202, and a second gas delivery module 244 to deliver either the first gas or a second gas or different composition than the first gas to the first chamber 202. The first gas delivery module 242 is configured to deliver the first gas a high pressure to the first chamber 202, e.g., at pressures of 10-80 bar. In contrast, the second gas delivery module 244 is configured to deliver gas at a low pressure, e.g., at less than 1 bar.

The delivery modules 242, 244 are connected to facility supplies or gas tanks that supply the respective gases. The delivery modules 242, 244 are connected to the chamber 202 by respective delivery lines 252, 254. The delivery line 252 to the first gas delivery module 242 can include a high-pressure isolation valve 232, and the delivery line 254 to the second gas delivery module 244 can include a low-pressure isolation valve 234.

The first gas can be supplied to the first gas delivery module 242 at a pressure that is above atmospheric pressure, but still relatively low compared to the eventual pressure in the first chamber. For example, the first gas can be delivered to the first gas delivery module 242 at a pressure of 40-80 psi (about 2.7 to 5.4 atm). The first gas delivery module 242 includes a pump, e.g., a booster pump. The pump increases the pressure of the incoming first gas, such as for example, the hydrogen gas. The pump 372 can increase the pressure by a factor of about two to twenty, in some cases up as high as 80 atm.

The gas can be supplied to the second gas delivery module 244 at a pressure that is above atmospheric pressure, but still relatively low compared to the eventual pressure in the first chamber. For example, the gas can also be delivered to the second gas delivery module 244 at a pressure of 40-80 psi (about 2.7 to 5.4 atm). However, the second gas delivery module 244 need not include a pump. Rather, conventional mass flow controller, liquid flow meter or liquid flow controller can be used to direct the gas to the first chamber 202.

The first gas delivery module 242 and the second gas delivery module 244 can be contained within a common housing 246. In some implementations, the interior of the housing 246 is fluidly separated from other containment vessels discussed below. An exhaust system 248 can be used to evacuate the interior of the housing 246. This can prevent build-up of corrosive or explosive gas within the housing in case of leaks from the gas delivery system. In some implementations, the containment assembly includes multiple parts each of which is a pressure-containing enclosure that surrounds and encapsulates a respective gas delivery module. For example, the first gas delivery module 242 can be enclosed in a first housing, the steam delivery module 244 in a housing. The exhaust system 248 can be coupled to the foreline 214, or to a separate vacuum system.

The first gas includes a processing gas, e.g., $H_2$, $NH_3$, $O_2$ or $O_3$. In some implementations, the first gas is a substantially pure processing gas. Alternatively, the first gas can include both a processing gas and an inert gas, e.g., argon.

As noted above, the gas from the second gas delivery module 244 can be the same composition as the first gas, or be a different second gas. The second gas can also be a substantially pure processing gas, or a combination of a processing gas and an inert gas. In some implementations, the second gas includes water, e.g., the second gas can be steam, such as dry or superheated steam.

The high-pressure system 200 includes a foreline 214 connecting the second chamber 204 to the vacuum processing system 208. An outer isolation valve 216 is arranged along the foreline 214 to isolate the pressure within the second chamber 204 from the pressure of the vacuum processing system 208. The outer isolation valve 216 can be operated to adjust the pressure within the second chamber 204 and to release gases within the second chamber 204. The outer isolation valve 216 can be operated in conjunction with the vacuum processing system 208 to regulate the pressure within the second chamber 204.

The vacuum processing system 208 is configured to lower the pressure of the second chamber 204 to be at near-vacuum pressure, e.g., less than 1 milliTorr. In particular, the vacuum processing system 208 can lowers the pressure within the second chamber 204 to near vacuum, thereby creating the appropriate low pressure environment for transfer of the substrate. During operation, the ultra-high pressures achieved in the first chamber 202 (e.g., above 10 atm, above 15 atm) require a corresponding higher pressure in the second chamber 204 (below about 1 atm (e.g., approximately 0.85 atm or 640 Torr).

In some instances, the vacuum processing system 208 includes a dry line pump. To accommodate unusually high pressure (e.g., prevent the high pressure caused by a leak from breaching the dry line pump) the gas is expanded before reaching the dry line pump. In some instances, the gas flows through a large diameter diffuser, e.g., 20 inch by 5 ft. tall diffuser.

The gas delivery system 206 includes an exhaust line 211 to exhaust the first gas from the first chamber 202, thereby depressurizing the first chamber 202. In some implementations, the exhaust line is coupled to an exhaust system, e.g., the foreline 214 and the vacuum processing system 208, or a separate vacuum system source. The exhaust line 211 can include an inner exhaust isolation valve 230 that can be closed to isolate the first chamber 202 from the exhaust system.

To increase safety, the system 200 can include a containment assembly. The containment assembly can include at least a containment enclosure 260 that encloses the delivery lines 252, 254 where they enter the chamber 204 to be fluidically connected to the chamber 202. In addition, each delivery line 252, 254 can be enclosed in a respective conduit 256, 258 that extend between the housing 246 and the enclosure 260.

The containment assembly can also include a containment exhaust line 268. The containment exhaust line 268 encloses the exhaust line 211 between the containment enclosure 260 and the exhaust system. The containment exhaust line 368 also fluidly connects the containment enclosure 360 to the exhaust system, e.g., to the foreline 214 and the vacuum processing system 208, or the separate vacuum system source. Thus, any leak in the delivery lines 252, 254, or from the junction of the delivery lines and the second chamber 204, is drawn through the containment enclosure 360 and vented to the exhaust system.

Each line delivery line 252, 254 has a pressure relief line with a pressure relief valve 252a, 254a within the containment enclosure 260. Any pressure buildup inside delivery lines 352, 354, 356 that is released by the pressure relief line will flow into the containment enclosure 360 and be removed from the system 300, e.g., by containment exhaust line 368, or in some instances via separate exhaust channels 369 connected to exhaust system 311.

The system 200 also includes a pressure relief line that couples the first chamber 202 to a pressure relief valve 276. The pressure relief valve 276 can be positioned in the second chamber 204. In this case, if the pressure in the first chamber 202 exceeds permissible levels, gas that is released by the pressure relief valve 276 will flow into the outer chamber 204 and be removed through the foreline 214. Alternatively, the pressure relief valve 276 can be positioned in the containment enclosure 360. In this case, gas that is released by the pressure relief valve 276 will be removed through the exhaust line 211.

Thus, all pressurized components can be contained within the containment assembly so that the system 200 can relieve unexpected leaks, ruptures, or breaches without ever exposing pressurized gas the atmosphere.

Multiple gas sensors 280 are included in the system 200. In particular, the gas sensors 288 can be hydrogen sensors. A sensor 280 is integrated into possible leak locations, e.g., inside containment enclosure 260, and inside exhaust line 268. If any sensor 280 detects a gas leak, for example hydrogen leak, the controller 210 will detect the signal from the sensor 280 and will shut first off the gas delivery module 242, shut off the pump within first gas delivery module 242, or take other appropriate action. Isolation valves in the delivery lines 252, 254 can also be closed in response to a leak being detected by one or more of the sensor 280.

In addition, the system 200 can include on or more pressure sensors 282. For example, there can be a first pressure sensor 282 in the first chamber 202 and a second pressure sensor 282 in the second chamber 204. The pressure sensors 282 are coupled to the controller 210.

Figure 3:
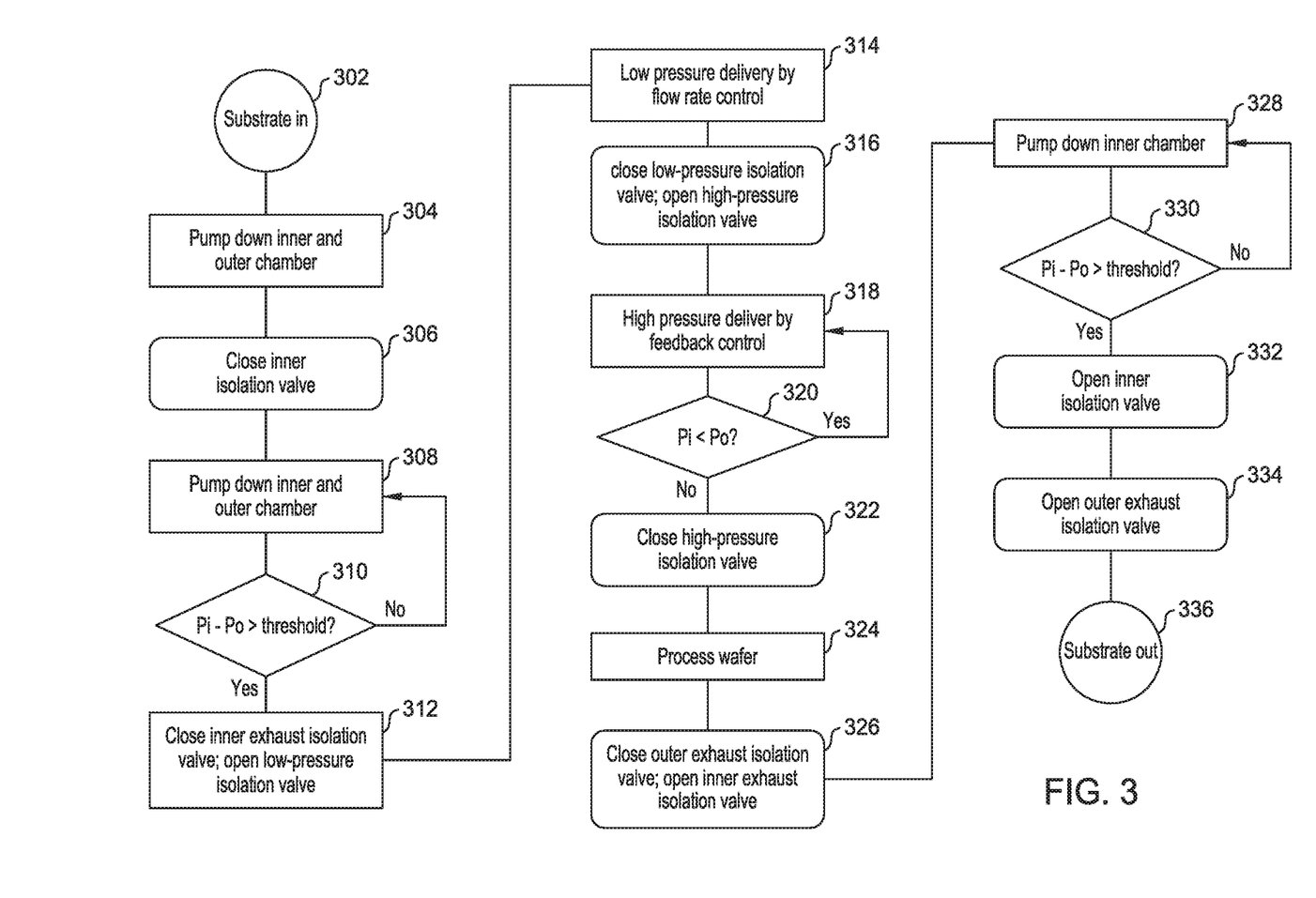
FIG. 3 is a flow chart illustrating a method of operating a high-pressure processing system.

A method of operating the system 200 to process a substrate is illustrated in FIG. 3. The system 200 starts with the isolation valves 212, 213 open. The substrate is inserted by a robot 106 or 108 through the open valves 212, 213 and the second chamber 204 into the first chamber 202 (at operation 302). The controller can operate the robot to carry the substrate 10 into the first chamber 202 and to place the substrate 10 on the pedestal.

The first and second chambers 202, 204 are pumped down to a first pressure, e.g., 100-300 milliTorr, by the vacuum system, and then maintained at the low pressure during the transfer of the substrate 10 (at operation 304). This can assist in prevention of oxidation of the substrate 10.

The first isolation valve 212 is closed (at operation 306). Optionally the second isolation valve 213 can be closed as well.

The vacuum system is used to further pump down the first chamber 202 to a second pressure that is lower than the first pressure, and to pump down the second chamber 204 to a third pressure that is lower than the second pressure (at operation 308). For example, both the first and the second pressure can be 1-50 milliTorr. The first pressure can be 100-300 milliTorr and the second pressure can be 1-50 milliTorr.

The pressures in the first and second chambers 202, 204 are measured by the sensors 282, and the controller can receive signals from the sensors 282.

If a pressure in either chamber 202, 204 exceeds a leak threshold value, this can indicate that gas is leaking into the chamber from the external environment. In this case, processing of the substrate can be terminated.

In addition, the controller can compare the measured pressures (at operation 310). If the difference between the pressure P1 in the first chamber and the pressure P2 in the second chamber does not exceed a threshold value, then the evacuation of the chambers can be continued.

Once the chambers 202, 204 reach the desired pressures, the inner exhaust isolation valve 230 is closed and the low-pressure isolation valve 234 is opened (operation 312). This isolates the first chamber 202 from the exhaust system, but couples the first chamber 202 to the second gas delivery module 244.

Next, the second gas delivery module 244 delivers either the first gas or a second gas to the first chamber 202 (at operation 314). This raises the pressure in the first chamber 202 to a fourth pressure that is above the first pressure. The fourth pressure can be above atmospheric pressure, e.g., a pressure of 40-80 psi. Delivery of the gas by the second gas delivery module 244 can be performed using regular flow rate control, e.g., without a pressure servo control algorithm.

Once the inner chamber 202 has been elevated to the fourth pressure, the low-pressure isolation valve 234 is closed and the high-pressure isolation valve 232 is opened (at operation 316). This isolates the first chamber 202 from the second gas delivery module 244, e.g., to avoid damage to the second gas delivery module 244 due to the high pressures in the subsequent operations. This also couples the first chamber 202 to the first gas delivery module 244.

Next, the first gas delivery module 242 delivers the first gas to the first chamber 202 (at operation 318). This raises the pressure in the first chamber 202 to a fifth pressure that is above the fourth pressure. As noted above, the fifth pressure can be 10-80 atmospheres. Delivery of the gas by the first gas delivery module 244 can be controlled by the controller 210 using a pressure servo control algorithm.

The controller can compare the measured pressure P1 inside the first chamber 202 to a desired processing pressure PP (at operation 320). If the pressure P1 in the first chamber is less than the desired processing pressure PP, then pressurization of the first chamber 202 can be continued.

Once the inner chamber 202 has been elevated to the fifth pressure, the high-pressure isolation valve 232 is closed (at operation 322). This isolates the first chamber 202 from the first gas delivery module 242.

The substrate 10 is now processed in the first chamber 202 (at operation 324). Processing can proceed for a set time, e.g., as measured by a timer in the controller. The first gas can be an annealing gas that reacts with the layer on the substrate 10. Alternatively, the gas can include the material to be deposited onto the substrate 10. The proper temperature and pressure conditions in the first chamber 202 can cause the annealing or deposition of the material to occur. During processing, e.g., annealing or deposition, the controller can operate the one or more heating elements 219 in the support 218 to add heat to the substrate 10 to facilitate processing of the layer of material on the substrate 10.

When processing of the layer of material on the substrate 10 is complete, the outer isolation valve 216 is closed, and the inner isolation valve 230 is opened (at operation 326). This couples just the first chamber 202 to the exhaust system, while the second chamber 204 remains sealed.

The inner chamber is pumped down to a sixth pressure (at operation 328). The sixth pressure can be less than the first pressure but greater than the third pressure, e.g., about equal to the second pressure. Thus, the pressure is at a near-vacuum pressure such that the pressure differential between the first chamber 202 and the second chamber 204 is small.

Again, the controller can compare the measured pressures (at operation 330). If the difference between the pressure P1 in the first chamber and the pressure P2 in the second chamber does not exceed the threshold value, then the evacuation of the chambers can be continued.

Once the inner chamber 202 has reached the sixth pressure, the first isolation valve 212 is opened (at operation 232). In addition, if closed, the second isolation valve can be opened as well. Then the outer exhaust isolation valve 116 is opened. Because both inner and outer exhausts share the same foreline, keeping the outer exhaust isolation valve closed during inner exhausting can protect the lift pin and heater bellows from damage.

Finally, the substrate 10 can be removed from the first chamber 202 using the robot 106 or 108, and, if necessary, transferred to a subsequent process chamber.

Figure 4:
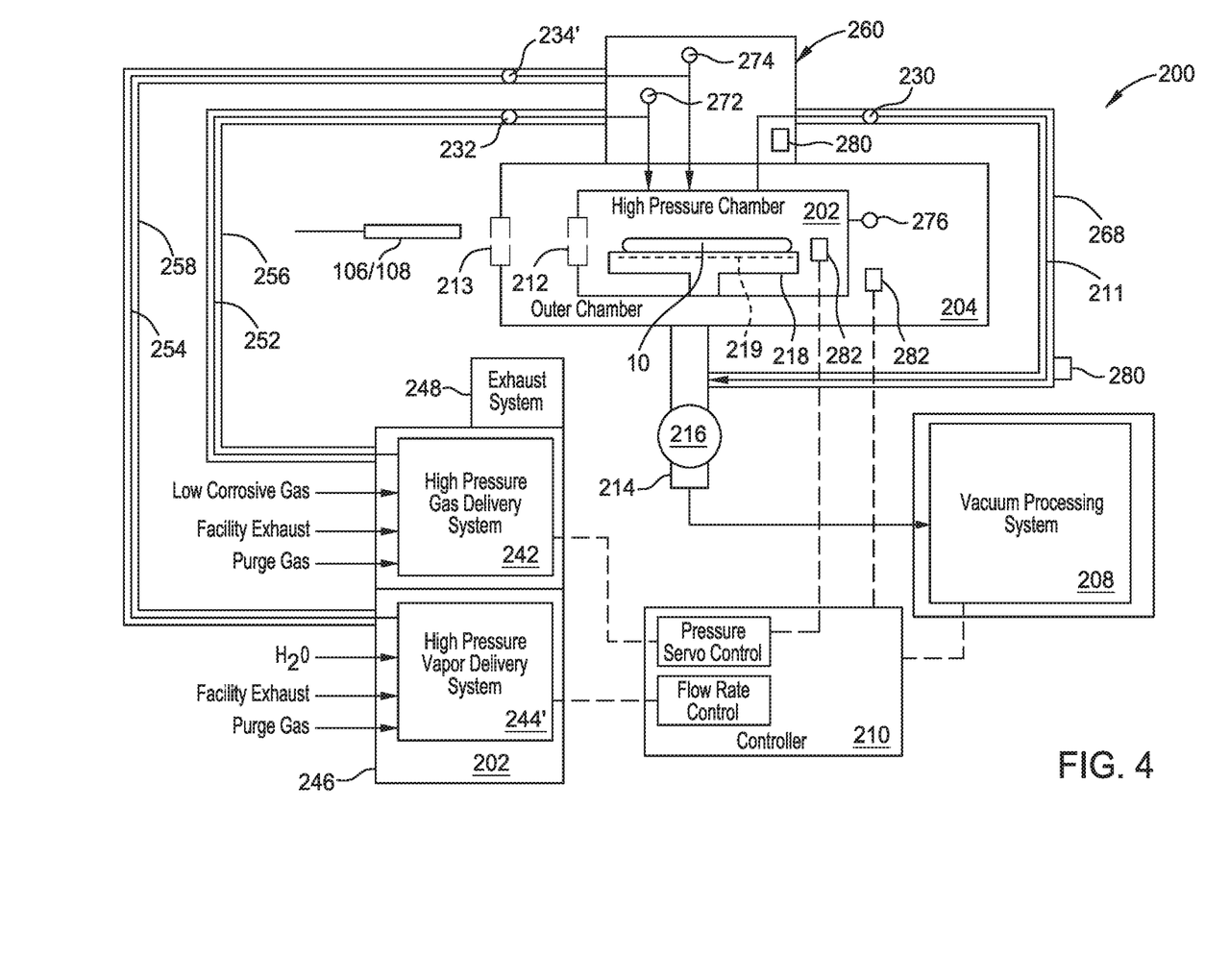
FIG. 4 is a diagram of another implementation of a high-pressure processing system with enhanced safety features.

FIG. 4 illustrates a controlled high-pressure processing system 200' that creates a high-pressure environment for processing a substrate and a low-pressure environment for the substrate when the substrate is being transferred between processing chambers. The system 200' can be the same as the system 200, except that the second gas delivery module 244' is a high pressure gas delivery module that can deliver a second gas to the first chamber 202 at high pressures, e.g., at pressures of 10-80 bar. The second gas is a liquid vapor, e.g., steam. The valve 234' in the delivery line 254 is a second high pressure isolation valve.

Figure 5:
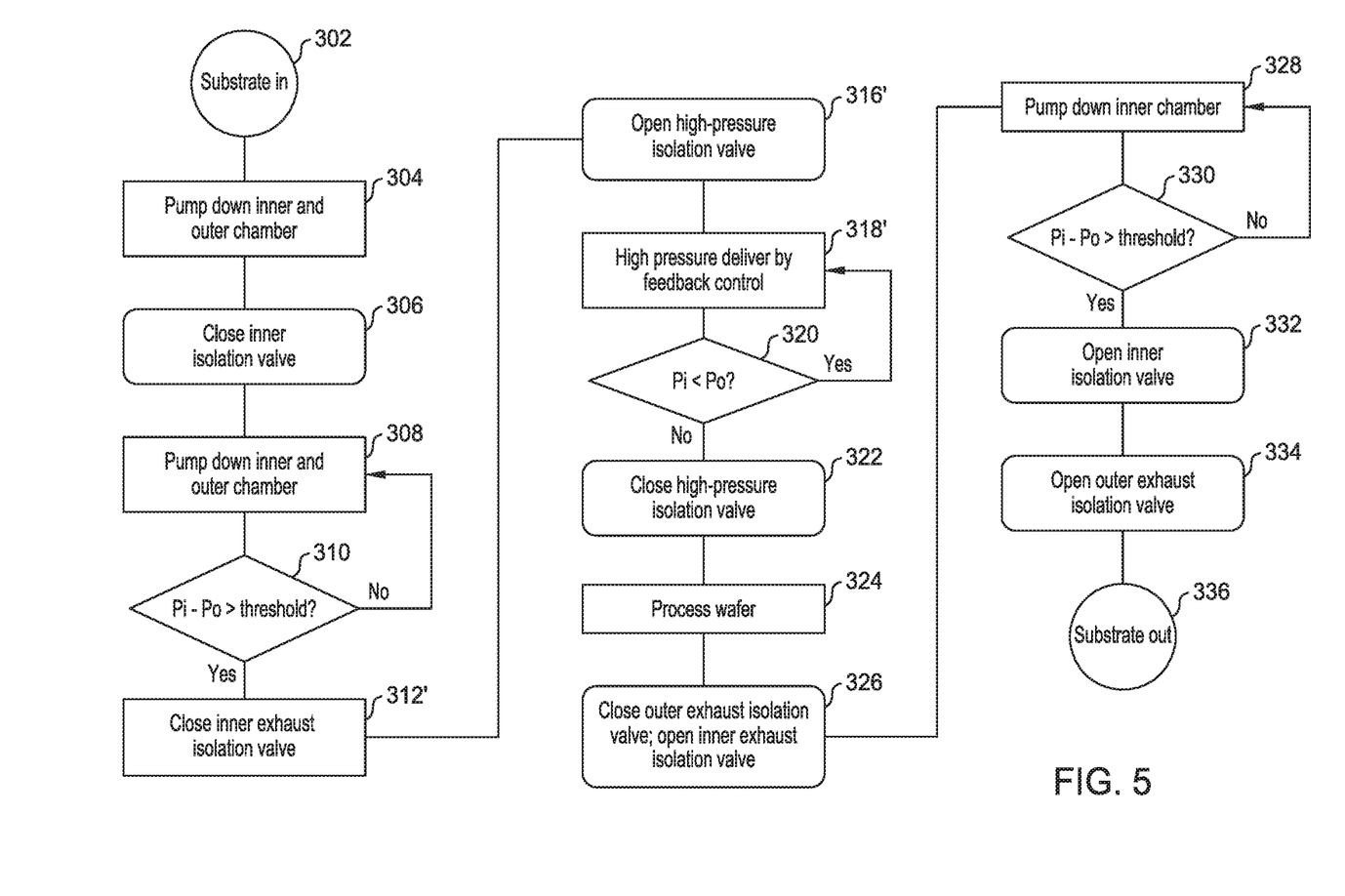
FIG. 5 is a flow chart illustrating a method of operating a high-pressure processing system.
Figure 6:
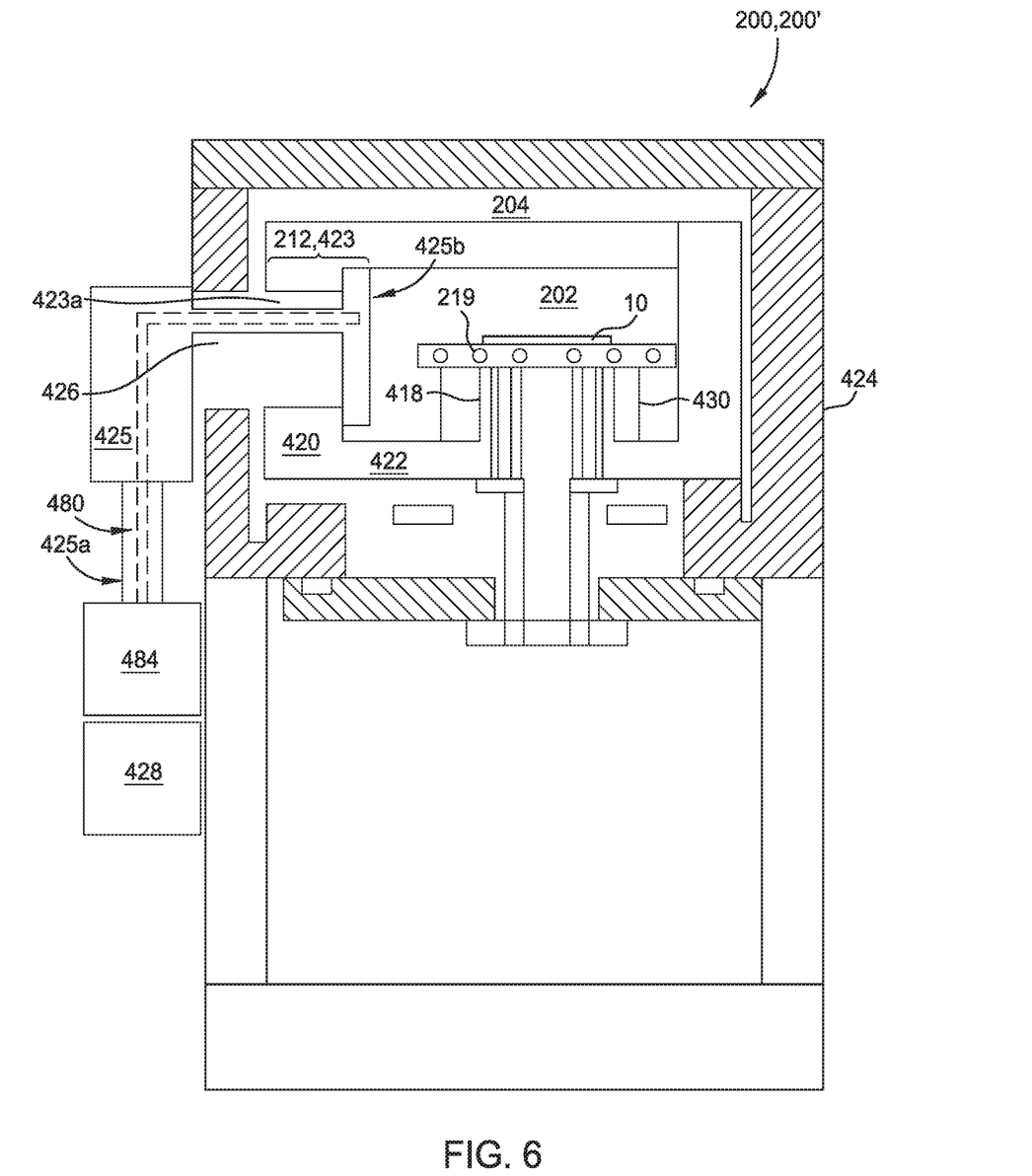
FIG. 6 is a schematic side view of a chamber for a high-pressure processing system.

A method of operating the system 200 or 200' to process a substrate is illustrated in FIG. 5. This process similar to the process described with reference to FIG. 3, except as discussed below.

In particular, the method of operating the system 200 or 200' supplies gas to reach a high pressure in the first chamber 202 in a single operation, rather than in multiple stages. Thus, this process could be performed using only the first gas delivery module 242 of the system 200, or using only the first gas delivery module 242 of the system 200', or using only the second gas delivery module 244' of the system 200', or using both the first gas delivery module 242 and the second gas delivery module 244' of the system 200' but operating the second gas delivery module 244' to mimic the first gas delivery module 242 (e.g., the isolation valves of the gas delivery modules open and close at the same time, etc.).

In particular, the inner exhaust isolation valve 230 is closed (at operation 312'), and the high-pressure isolation valve 232 and/or 234' is opened (at operation 316'). The first gas delivery module 242 and/or the second gas delivery module 244' delivers the first gas and/or the second gas to the first chamber 202 (at operation 318'). This raises the pressure in the first chamber 202 from the second pressure to the fifth pressure. As noted above, the fifth pressure can be 10-80 atmospheres. Delivery of the gas by the first gas delivery module 244 can be controlled by the controller 210 using a pressure servo control algorithm.

The gas delivered to the first chamber 202 can include $H_2$ or $NH_3$, e.g., if only the first gas delivery module 242 of the system 200 or only the first gas delivery module 242 of the system 200' is used. Alternatively, the gas delivered to the first chamber 202 can include a liquid vapor, e.g., steam, e.g., if only the second gas delivery module 244' of the system 200' is used. Alternatively, the gas delivered to the first chamber 202 can include a mixture of stem and another process gas, e.g., if both the first gas delivery module 242 and the second gas delivery module 244' of the system 200' are used.

FIG. 4 illustrates a possible configuration for a first chamber 202 and second chamber 204 in a high-pressure processing system 200 (or 200'). The high-pressure processing system 200 further includes the valve assembly 212 between the first chamber 202 and the second chamber 204. This implementation can have the second chamber 204 be part of the transfer chamber, e.g., be in pressure equilibrium.

The second chamber 204 can be defined by volume between inner walls 420 and outer walls 424. In addition, the substrate 10 is supportable on a pedestal 418 (that provides the substrate support 218). One or more elements 219, e.g., a resistive heater, can be embedded in the pedestal 418. The substrate can sit directly on the pedestal 418, or sit on a lift pin assembly 430 that extends through the pedestal.

The valve assembly 212 is formed by an arm 425 movable relative to the inner walls 420 and the base 422 of the first chamber 202. In particular, the valve assembly 212 includes a slit valve 423 between the first chamber 202 and the second chamber 204. The slit valve 423 includes a slit 423a and the arm 425. The slit 423a extends through one of the inner walls 420 of the first chamber 402. A vertical end 425a of the arm 425 is positioned outside of the first chamber 202 while a horizontal end 425b of the arm 425 is positioned within the first chamber 202. The vertical end 425a of the arm 425 can be positioned within the second chamber 204 and be driven by an actuator positioned within the second chamber 204. Alternatively, the vertical end 425a of the arm 425 is positioned outside of the second chamber 204 and is thus driven by an actuator 428 that is also positioned outside of the second chamber 204.

The arm 425 extends through the slit 423a and is movable relative to the walls 420 so that the arm 425 can be moved to a position in which it forms a seal with the walls 420. The actuator 428 is coupled to the vertical end 425a of the arm 425 and drives the horizontal end 425b of the arm 425 relative to the walls 420. The arm 425 is movable vertically to cover or uncover the slit 423a. In particular, the vertical end 425a of the arm 425 can be or include a flange that extends substantially parallel to the adjacent inner surface of the inner wall 420. The arm 425 can also be driven laterally so that the horizontal end 425b of the arm 425 can engage or disengage the wall 420. The arm 425 can also extend through an aperture 426 in the outer wall 424.

The valve assembly 212 is movable between an open position and a closed position. When the valve assembly 212 is in the open position, the horizontal end 425b of the arm 425 is spaced laterally apart from the wall 420, e.g., the inner surface of the wall 420. In addition, the horizontal end 425b of the arm 425 is positioned vertically so that the slit 423a is uncovered. The slit 423a thus provides an opening that enables fluidic communication between the first chamber 202 and the second chamber 204 and that also enables the substrate 10 to be moved in and out of the first chamber 202, e.g., by a robot as discussed above.

When the valve assembly 212 is in the closed position, the horizontal end 425b of the arm 425 covers the slit 423a and contacts one of the walls 420, thereby forming the seal to isolate the first chamber 202 from the second chamber 204. When pressurized, the flange or horizontal end 425b contacts an inner surface of the wall 420 defining the first chamber 202. An O-ring is placed along the circumference of the horizontal end 425b on the surface that contacts the wall 420, helping to reinforcing the seal of containment when the first chamber 402 is pressurized.

The heating elements 219 in the pedestal 418 heat the gas in the first chamber 202, e.g., to up to 250° C. To prevent damage to the O-ring, the arm 425 can includes an internal gas channel 480. The internal gas channel 480 is supplied from cooling gas supply 484 and is a conduit to let the cooling gas flow through the arm 425. The internal gas channel 480 can extend through the horizontal end 425b, or through both the horizontal end 425b and the vertical end 425a. The internal gas channel and cooling gas supply 484 can be configured such that when the valve assembly 212 is in the open position no gas is available from the cooling gas supply 484, preventing cooling gas flow when transfer of the substrate is occurring.

A number of embodiments of the invention have been described. Nevertheless, it will be understood that various modifications may be made without departing from the spirit and scope of the invention. For example, while the foregoing describes the formation of a metal silicide layer from a cobalt or nickel layer film, in some implementations, other materials can be used. For example, other materials can include titanium, tantalum, tungsten, molybdenum, platinum, iron, niobium, palladium, and combinations thereof, and other alloys including nickel cobalt alloys, cobalt tungsten alloys, cobalt nickel tungsten alloys, doped cobalt and nickel alloys, or nickel iron alloys, to form the metal silicide material as described herein.

Although described above in the context of an annealing or deposition system, depending on the gasses provided, the high-pressure chamber can be used for an etching system. Alternatively, the high-pressure chamber can be filled with an inert gas, and the high-pressure chamber can be used purely for heat treatment at high pressure. The processing platforms described herein can include other types of processing chambers. For example, a processing platform can include an etching chamber to etch patterns onto a surface of a substrate.

Each of the different chambers of a processing platform can have varying pressure environments, ranging from near-vacuum to more than 50 atmospheres. The isolation valves, e.g., vacuum valves, between the chambers can isolate the pressures from one another such that these varying pressure environments can be maintained within each chamber.

Accordingly, other embodiments are within the scope of the following claims.

What is claimed is:

1. A high-pressure processing system for processing a layer on a substrate, the system comprising:
   a first chamber;
   a support configured to hold the substrate in the first chamber;
   a second chamber adjacent the first chamber;
   a foreline configured to remove gas from the second chamber;
   a vacuum processing system configured to lower a pressure within the second chamber to near vacuum;
   a valve assembly between the first chamber and the second chamber and configured to isolate the first chamber from the second chamber;
   a gas delivery system configured to introduce one or more gases into the first chamber and to increase a pressure within the first chamber to at least 10 atmospheres while the first chamber is isolated from the second chamber, the gas delivery system including:

a first gas delivery module configured to deliver a first gas at a first pressure that is at least 10 atmospheres; and a second gas delivery module configured to deliver the first gas or a second gas of different composition at a second pressure that is less than the first pressure but greater than 1 atmosphere;

a controller configured to operate the gas delivery system and the valve assembly;

a first exhaust system comprising an exhaust line and configured to remove gas from the first chamber;

a common housing surrounding both the first gas delivery module and the second gas delivery module; and a second exhaust system configured to remove gas from the common housing.

2. The system of claim 1, wherein the second exhaust system is configured to direct gas from the common housing to the foreline.

3. The system of claim 1, further comprising first and second delivery lines coupling the first and second gas delivery modules to the first chamber, and a containment enclosure configured to divert gas leaking from the first and second delivery lines to the foreline.

4. The system of claim 3, wherein the common housing is fluidically isolated from the containment enclosure.

5. A high-pressure processing system for processing a layer on a substrate, the system comprising:
   a first chamber;
   a support configured to hold the substrate in the first chamber;
   a second chamber substantially surrounding the first chamber;
   a foreline configured to remove gas from the second chamber;
   a vacuum processing system configured to lower a pressure within the second chamber to near vacuum;
   a valve assembly between the first chamber and the second chamber and configured to isolate the first chamber from the second chamber; and
   a gas delivery system configured to introduce one or more gases into the first chamber and to increase a pressure within the first chamber to at least 10 atmospheres while the first chamber is isolated from the second chamber, the gas delivery system including:
      a first gas delivery module configured to deliver a first gas at a first pressure that is at least 10 atmospheres; and
      a second gas delivery module configured to deliver the first gas or a second gas of different composition at a second pressure that is less than the first pressure but greater than 1 atmosphere;
      an exhaust system comprising an exhaust line and configured to remove gas from the first chamber; and
      a controller configured to:
         operate the valve assembly to isolate the first chamber from the second chamber;
         operate the second gas delivery module to raise the first chamber from a pressure below 1 atmosphere to the second pressure;
         operate the first gas delivery module to raise the first chamber from the second pressure to the first pressure when the second gas delivery module is isolated from the first chamber.

6. The system of claim 5, wherein the first gas delivery module comprises a pump configured to increase pressure of the first gas before the first gas is delivered to the first chamber.

7. The system of claim 6, wherein the second gas delivery module uses a mass flow controller, a liquid flow meter or a liquid flow controller to direct the gas to the first chamber.

8. The system of claim 5, further comprising a first pressure sensor in the first chamber and a second pressure sensor in the second chamber.

9. The system of claim 8, wherein the controller is further configured to:
   cause the exhaust system to reduce pressure in the first chamber;
   cause the vacuum processing system to reduce pressure in the second chamber;
   compare measurements from the first pressure sensor and the second pressure sensor; and
   control the exhaust system and the vacuum processing system such that a pressure in the first chamber is higher than a pressure in the second chamber.

* * * * *